United States Patent [19]
Hofmann

[11] Patent Number: 5,751,902
[45] Date of Patent: May 12, 1998

[54] ADAPTIVE PREDICTION FILTER USING BLOCK FLOATING POINT FORMAT AND MINIMAL RECURSIVE RECOMPUTATIONS

[75] Inventor: Rudolf Hofmann, Forchheim, Germany

[73] Assignee: U.S. Philips Corporation, New York, N.Y.

[21] Appl. No.: 362,514

[22] PCT Filed: May 2, 1994

[86] PCT No.: PCT/IB94/00086

§ 371 Date: Jan. 5, 1995

§ 102(e) Date: Jan. 5, 1995

[87] PCT Pub. No.: WO94/25960

PCT Pub. Date: Nov. 10, 1994

[30] Foreign Application Priority Data

May 5, 1993 [DE] Germany ............ 43 14 921.9

[51] Int. Cl.$^6$ .................................................. G06F 7/38
[52] U.S. Cl. ................. 395/2.28; 364/745; 364/724.19
[58] Field of Search .................. 364/724.19, 745; 395/2.28, 2.38

[56] References Cited

U.S. PATENT DOCUMENTS

| | | | |
|---|---|---|---|
| 3,842,250 | 10/1974 | Anderson | 235/175 |
| 4,520,491 | 5/1985 | Raulin et al. | 375/27 |
| 5,025,404 | 6/1991 | Janssen et al. | 364/723 |
| 5,142,656 | 8/1992 | Fielder et al. | 381/37 |

OTHER PUBLICATIONS

Draft text for Annex A of G.728–16 kbit/s Fixed Point Specification, Temporary Doc. 41(P), CCIT Study Group 15, Geneva, 7–17 Sep. 1993, pp. 1–18.

CCIT Recommendation G. 728, Coding of Speech Signals At 16 kbit/s Using Low–Delay Code Excited Linear Prediction, Geneva 1992.

*Primary Examiner*—Allen R. MacDonald
*Assistant Examiner*—Robert C. Mattson
*Attorney, Agent, or Firm*—Leroy Eason

[57] ABSTRACT

An adaptive prediction filter which provides recursive calculation of prediction coefficients from sampled values of segments of a sampled audio signal. In order to obtain improved computation accuracy the coefficients are in block floating point format, and are recursively calculated from reflection coefficients. Upon calculation of a kth reflection coefficient the k-1 previously computed prediction coefficients are recomputed again based thereon. In the event that results in an overflow of the number of bits in the mantissa of a prediction coefficient which is being calculated, the block floating point format is adapted by increasing the common exponent of the block. That conventionally required recalculation of all previously recalculated coefficients. The invention recognizes that it is only necessary to recalculate the prediction coefficients beginning with one at which overflow occurred, because the mantissa values of the previously computed coefficients will remain the same as if they were again recomputed using the revised block floating point format. A considerable saving in computation time is thus achieved.

7 Claims, 4 Drawing Sheets

PRIOR ART (3-BIT COMPUTATION)

FIG. 5b (4-BIT COMPUTATION THEN ROUNDED TO 3-BITS)

FIG. 5c

ADAPTIVE PREDICTION FILTER USING BLOCK FLOATING POINT FORMAT AND MINIMAL RECURSIVE RECOMPUTATIONS

RELATED APPLICATION

This application is related to concurrently filed copending application Ser. No. 08/362,513, of the same inventor, Attorney Docket No. PHD 93-066. Such related application pertains to a linear predictive coder or decoder wherein recursive recomputations of prediction coefficients are performed more accurately and without increasing the complexity of the required calculations. The present application relates to a linear predictive coder or decoder wherein the number of recursive recomputations which must be repeated when an overflow occurs is minimized by only performing such repeated recomputations starting with the prediction coefficient at which the overflow occurred. That is feasible because the values of the previously recomputed coefficients will correspond to the values that would be obtained if they were again recomputed using a revised block floating point format.

BACKGROUND OF THE INVENTION

1. Field of the Invention

The invention relates to a transmission system comprising a coder for coding a signal, a transmitter for transmitting the coded signal to a receiver, which includes a decoder for decoding the coded signal, and an adaptive prediction filter.

The invention likewise relates to a terminal unit, a coder, a decoder and an adaptive prediction filter.

2. Description of the Related Art

Such a transmission system can be assembled, for example, without difficulty from the document (I) "Draft text for Annex A of G.728 16 Kbits Fixed Point Specification", Temporary Document 41(P), CCIT Study Group 15, Geneva, 7–17 Sept. 1993, which corresponds to no longer available Doc. AH. 93-D.3, CCITT Study Group XV, London, Mar. 29–30, 1993; and from the document (II) CCITT Recommendation G.728, "Coding of speech signals at 16 kbit/s using low-delay code excited linear prediction, Geneva 1992". The two documents I and II will henceforth be referenced [I] and [II]. Such transmission systems can always be used when multiple use is to be made of a given transmission capacity. The coding reduces the bit rate of a signal and thereby makes it possible, for example, to hold four telephone conversations simultaneously over one 64 kbit/s transmission channel.

The multiple use of a given transmission capacity has very much importance in radio channels, as will be readily understood if one considers the rising number of subscribers of mobile radio systems. Also the storage capacity of a memory with an arbitrary storage medium can be used to considerably more advantage when bit rate reducing coders and appropriate decoders are used, because less storage space is necessary for storing an information signal.

It is known to utilize linear prediction for bit rate reduction. In [I] and [II] prediction coefficients are computed by an adaptive prediction filter. The computation is performed segment by segment using sample values of an auxiliary signal which may be an (electric) audio signal or a speech signal, for example, coming from a person. Alternatively, it is possible for the auxiliary signal to be a synthetic audio or speech signal as produced in a coder which operates according to the principle of "analysis by synthesis". A linear correlation between a predicted sampling value (prediction value) of the auxiliary signal and previous sampling values of this signal is realised with prediction coefficients. The prediction coefficients are determined so that the sum of the squares of all the errors computed for a segment of sampling values assumes a minimum value. An error is here meant to be understood as the difference between a sampling value and its predicted value. More accurate descriptions will be given hereinbelow.

In [I] and [II] an excited signal is converted into a synthetic audio signal by a synthesis filter. This synthetic audio signal is subtracted from an audio signal to be coded and the difference is used for optimizing selection of the excited signal.

The computation of the prediction coefficients calls for correlation coefficients which are derived from the sampling values of the synthetic audio signal. The computation of the prediction coefficients on the basis of the correlation coefficients calls for much circuitry and cost. To reduce this circuitry and cost the prediction coefficients are computed recursively. To begin with, a first reflection coefficient is computed from the two first correlation coefficients. From the first reflection coefficient the first prediction coefficient is derived. Furthermore, also a prediction error is computed, which is an indication of the quality of the prediction. Then, a next (second) reflection coefficient is computed from the next (second) correlation coefficient, the previously computed prediction coefficients (at this point only the first prediction coefficient is concerned) and the current prediction error. With this (second) reflection coefficient and the previously computed prediction coefficients the previously computed prediction coefficients are recomputed. Then, a next (second) prediction coefficient and a new prediction error are computed. The recomputation of the previously computed prediction coefficients and the computation of a further prediction coefficient is repeated as many times as necessary to drive all the necessary prediction coefficients.

In [II] an implementation in floating point arithmetic is proposed for obtaining sufficient accuracy. The drawback of an implementation in floating point arithmetic is the extensive circuitry. For this reason, in [I] there is proposed to implement 16-bit fixed point arithmetic in which results and intermediate results of the computation are retained in the so-called block floating point format. This is meant to be understood as the representation of a block of numbers in floating point format, with the restriction, however, that all the numbers of the block have the same exponent (with base 2). The common exponent is selected such that all the mantissas are situated within prescribed limits. In [I] there is provided that all the mantissas are situated between −1 and +1. In the block floating point format, for example, the prediction coefficients are known, to from previous experience, assume values that may be of the order of 10. If, for example, overflow occurs when the prediction coefficients are recomputed, i.e. a recomputed prediction coefficient will be 1 or exceed 1, the mantissas of all the previously computed prediction coefficients will be divided by 2 and the common exponent (with base 2) will be increased by 1. Then the recomputation is started anew. The change of the block floating point format due to overflow will here be called adaptation of the block floating point format. For the repeated recomputation only the mantissas of the previously computed prediction coefficients are used, and only with 16-bit resolution. The reduction of the resolution from at least 17 bits to 16 bits which is sometimes necessary for the computation can be effected in different manners. The manner of reduction according to [I] will be outlined with the aid of an example. If, for example, the third reflection coefficient has just been computed with a resolution of 17 bits—between the third reflection coefficient and the third prediction coefficient to be derived therefrom there is only a difference in the numerical representation—it is shortened by a rounding to 16 bits, so that the two first prediction coefficients can be recomputed therewith in 16-bit fixed point arithmetic. If there is an overflow during this recomputation, also the rounded third reflection coefficient is, for example, divided by two when recomputation has ended, and the result which has a resolution of 16 bits is stored as a mantissa of the third prediction coefficient. The division is broken off after 16 bits (including the sign bit). Due to the binary system this operation corresponds to a shift of the decimal point by one position while the least-significant bit is lost. This procedure causes the inaccuracies—especially with a large number of prediction coefficients—to become unacceptably large.

SUMMARY OF THE INVENTION

It is an object of the invention to reduce the computation circuitry and cost in a transmission system of the type defined in the opening paragraph, without reducing the computational accuracy.

Such a transmission system employs a transmitter having a coder for coding a sampled audio signal and the coded signal is then transmitted to a receiver. The receiver includes a decoder for decoding such signal. The coder and decoder each include an adaptive prediction filter which includes first processing means for computing correlation coefficients from segments of sampling values of an auxiliary signal that corresponds to the audio signal or the decoded signal, second processing means for determining reflection and prediction coefficients from the correlation coefficients in N-bit fixed point arithmetic, and third processing means which in cooperation with the second processing means calculates prediction coefficients in block floating point format. The calculation is recursive based on successively calculated reflection coefficients. Upon calculation of a kth reflection coefficient the k−1 previously computed prediction coefficients are recomputed again based thereon. In the event that results in an overflow of the number of bits in the mantissa of a prediction coefficient which is being calculated, the block floating point format is adapted by increasing the common exponent of the block. That conventionally required recalculation of all previously recalculated coefficients. The invention recognizes that it is only necessary to recalculate the prediction coefficients beginning with the one at which overflow occurred, because the mantissa values of the previously computed coefficients will remain the same as if they were again recomputed with the revised block floating point format. A considerable saving in computation time is thus achieved.

The aforesaid feature of the present invention may combine with the feature of Applicants copending application identified above for achieving increased computation accuracy. Namely, a kth reflection coefficient is computed with a minimum resolution N+1 bits, is buffered with that resolution, and then converted to the above-mentioned revised block floating point format whose mantissa has a resolution of at least N+1 bits. The mantissa so obtained is then rounded to N bits and stored as the mantissa of the kth prediction coefficient.

This feature of a transmission system according to the invention distinguishes from a transmission system described in [I] in that the $k^{th}$ reflection coefficient after its first computation is buffered with a minimum accuracy of N+1 bits. For the recomputation of the k−1 previously computed prediction coefficients a value is used which distinguishes itself from the buffered value by a limitation to N bits. If overflow occurs during the recomputation of the k−1 previously computed prediction coefficients, the buffered value is divided, for example, by 2 after the recomputation has finished, and then rounded to N bits. This way of incorporating the $k^{th}$ prediction coefficient in the (adapted) block floating point format produces an error which is at most as large as the corresponding error in [I]. However, equally important that the sign of the error according to the invention turns of to be as often positive as negative, which is different from [I].

These assertions will now be explained with the aid of two simple examples

Let us assume that three (N=3) bits are available for representing the results and at least four bits for intermediate results. Furthermore, let us assume that the adaptation due to overflow requires a division by 4. Numerical examples for $k^{th}$ reflection coefficients having a 4-bits resolution in fixed point representation are started from.

In a first example a $k^{th}$ reflection coefficient has a value of +⅝. In the binary system this reflection coefficient is represented as 0.101, the first zero denoting the sign. According to [I] the procedure is as follows:

a) 0.101 ($k^{th}$ reflection coefficient: +⅝ with 4-bits resolution)

b) 0.11 (value of b) rounded to 3 positions for the recomputation of the k−1 previously computed prediction coefficients)

c) 0.00 (value of b) divided by 4, also with 3-bits resolution. This value is the mantissa of the $k^{th}$ reflection coefficient in the block floating point format with the exponent 2 and with base 2)

For making an assertion about the error if the approximation c) is used in lieu of a), c) is first to be multiplied again by 4. The difference between the value resulting therefrom and the output value is the error F. In the present case (representation as a fraction) F=(−⅝)=−⅝.

In contrast, according to the invention there is provided:

a) 0.101 ($k^{th}$ reflection coefficient: +⅝ with 4-bits resolution), b) 0.001 (value of a) divided by 4, also with 4-bits resolution), c) 0.01 (value of b) rounded to 3 bits).

Analogous with the preceding observations we now have as an error: F=(1−⅝)=⅜.

If 0.011 (+⅜) is selected as the output value, there is a value of F=(0−⅜)=−⅜ for the error according to the same scheme of [I]. According to the invention, we now have: F=(0−⅜)=−⅜.

BRIEF DESCRIPTION OF THE DRAWINGS

The invention, and embodiments thereof will be explained with reference to the following drawing, in which.

DESCRIPTION OF THE PREFERRED EMBODIMENTS

Figure 1:
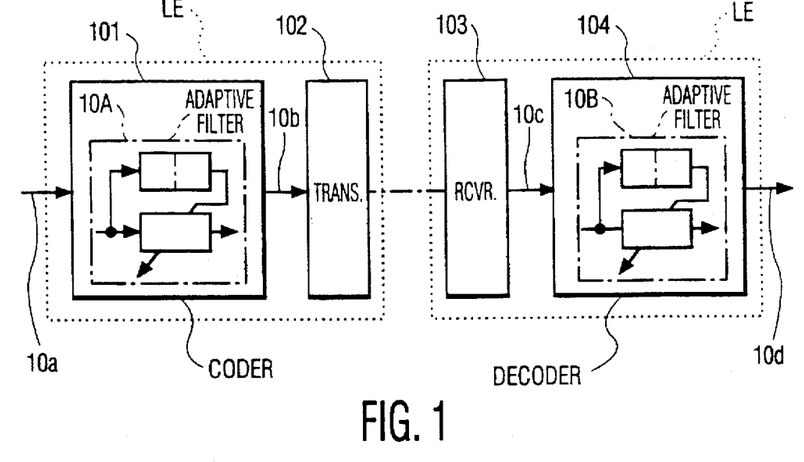
FIG. 1 shows a specific transmission system in which the invention can be used.

FIG. 1 gives a diagrammatic representation of a transmission system comprising a coder 101 and a transmitter 102 on a transmitting side and a receiver 103 and a decoder 104 on a receiving side. The combination of the coder 101 with the transmitter 102 and/or the combination of the receiver 103 with the decoder 104 forms a terminal unit LE.

The coder 101 codes a digitally sampled speech signal 10a by means of an adaptive prediction filter 10A. This filter has characteristic features according to the invention, which will become apparent in the following. The speech signal 10a has a bit rate of 64 kbit/s. The coder 101 reduces this bit rate to the bit rate of the coded signal 10b. The bit rate of the coded signal 10b is 16 kbit/s. The signal 10b consists of parameters of the speech signal 10a which parameters are determined segment by segment.

The transmitter 102 transmits the coded signal 10b—transcoded into a transmission code, as required—via a transmission channel shown in the drawing to the receiver 103 which transcodes the transmitted signal into a signal 10c and which signal corresponds to the signal 10b except for coding and transmission errors.

The decoder 104 decodes the signal 10c also with the aid of an adaptive prediction filter 10B. The result is a signal 10d. Except for coding, decoding and transmission errors the signal 10d corresponds to the speech signal 10a. The adaptive prediction filters 10A and 10B determine signal-dependent filter coefficients (prediction coefficients) according to the Levinson-Durbin Recursion. The Levinson-Durbin Recursion is an algorithm for determining in a step-by-step fashion the solutions of a linear set of equations of which the coefficient matrix is a Töplitz matrix, thus a symmetrical matrix having the same elements along a given diagonal.

The NCOF prediction coefficients (NCOF stands for the number of these coefficients) for an adaptive prediction filter are unequivocally a consequence of the requirement that the sum of the prediction error squares be minimized on average over a signal section of a given length.

For example, if speech signal sampling values s(k) are applied to the input of the filter, the following linear combination will be the output value of the filter at the instant n:

$$y(n) = \sum_{i=1}^{NCOF} a(i) * s(n-i) \quad (1)$$

The value y(n) is considered the predicted sampling value s(n). If the sum of the error squares is formed i.e.

$$\sum_{i=0}^{LSEG-1} [y(n+i) + s(n+i)]^2 \quad (2)$$

of a segment comprising LSEG sampling values, if (1) is put in (2) while the coefficients a(i) are minimized in (2), above set of equations with the Töplitz matrix will arise if the sampling values outside this segment are set to zero. The elements of the Töplitz matrix are in this case the values of the autocorrelation function of the input signal at the sampling instants of the input signal, which function will be referenced autocorrelation coefficient r(minc) hereinafter. A detailed representation of the Levinson-Durbin Recursion is found in: L. R. Rabiner/R. W. Schafer, "Digital Processing of Speech Signals", Prentice-Hall, 1978.

In the following the algorithm of the Levinson-Durbin Recursion expressed in Rabiner/Schafer by the equations (8.67) to (8.72), is represented as a pseudo code because this code permits a better detection of the program steps an arithmetic unit is to carry out for the computation of the prediction coefficients.

LEVINSON-DURBIN Recursion (Pseudo code)

Input values: NCOF=Predictor Coefficient
r(0) . . . r(NCOF)=Autocorrelation coefficients
Output values:a(0) . . . a(NCOF)=Prediction coefficients

```
a(0) = 1.0                                    O1
a(1) = - r(1) / r(0)                          O2
alpha = r(0) + r(1) * a(1)                    O3
For minc=2,3,4,...,NCOF                       O4
{ sum = 0                                     O5
    for ip=0,1,2,3,...,minc-1                 O6
        sum = sum + r(minc-ip) * a(ip)        O7
                                              O8
    rc = - sum / alpha                        O9
    alpha = alpha + sum * rc                  O10
                                              O11
    if(alpha <= 0.0) break                    O12
                                              O13
    For ip=1,2,3,...,minc/2                   O14
    { R1 = a( ip) + rc * a(minc-ip))          O15
      R2 = a(minc-ip) + rc * a( ip))          O16
      a(ip ) = R1                             O17
      a(minc-ip) = R2                         O18
                                              O19
      a(minc) = rc                            O20
                                              O21
```

To render the program steps given in the pseudo code even more transparent, several rows of the algorithm shown above will be further explained.

The predictor coefficient carrying the name of NCOF and the NCOF+1 autocorrelation coefficients are required as input data. The predictor coefficient NCOF is identical with the number of filter coefficients a(i) in equation (1). The autocorrelation coefficients r(0), r(1) and so on, up to r(NCOF) are determined by other functional units not disclosed here, which, however, are known to a person skilled in the art.

The prediction coefficients a(0), a(1) and so on, up to a(NCOF) are output data.

Rows 01 and 02 comprise assignments to the two first prediction coefficients. In row 03 there is an assignment to an auxiliary variable alpha (prediction error for NCOF=1) whose augend is the zero$^{th}$ autocorrelation coefficient and whose addend is the product of the first correlation coefficient and the first prediction coefficient.

If the predictor coefficient NCOF is equal to 1, the computation is over. Otherwise a loop having a running variable minc is passed through, which variable assumes all integers from 2 to NCOF. In the loop for the running variable minc all the previously computed prediction coefficients a(1), a(2) and so on, up to a(minc-1) are changed (recomputed), as is shown in rows 017 and 018. At the end of all the instructions which are to be carried out for the current value k of the running variable minc, a value is assigned to the prediction coefficient having the index minc, as is shown in row 020. This prediction coefficient is to be referenced the k$^{th}$ prediction coefficient; the variables sum and rc (reflection coefficient) which are computed for the first time for the current value k of the running variable minc are to obtain the same addition.

In the loop having the running variable minc two further loops are passed through which are not interleaved and have the running variable ip, the upper value of which variable depends on the current value of the running variable minc, as is shown in rows 06 and 014.

Auxiliary variables are those carrying the names of alpha, sum, rc, R1 and R2. The auxiliary variable alpha is the sum of the error squares according to equation (2), and also has a descriptive meaning; alpha is the energy content of the error signal (prediction error). This content is always to be positive. The computation is therefore broken off if there is a value for alpha smaller than or equal to zero, as is shown in row 012. Also the variable rc has a descriptive meaning; it is the so-termed reflection coefficient which plays a part in the so-called tube model of the vocal tract. A reflection coefficient which occurs as a quotient of the auxiliary variables sum and alpha, as is shown in row 09, belongs to each prediction coefficient.

Most real-time implementations of speech coding methods according to which also coefficients for adaptive filters are to be computed, are based on 16-bit fixed-point arithmetic units, while intermediate results are available partly with enhanced accuracy (for example, 32 bits). The accuracy of the result of the Levinson Recursion decisively depends on the computational accuracy in the recursion. As regards computational accuracy the most sensitive positions in the pseudo code are found where intermediate results of multiplication or division are available with higher resolution and are then to be reduced to the simple resolution. They are especially the rows 02, 03, 07, 09, 010, 015, 016 and 020.

A module for realising the Levinson-Durbin Recursion in 16-bit fixed-point arithmetic, will be described with reference to the following pseudo code. Several definitions are to be introduced first:

>>Right shift operation;

<<Left shift operation;

round (reg) Rounding operation performed on a 32-bit-wide register "reg". Let us assume that the bits in "reg" are numbered 0, 1, 2, ..., 31, while the sign bit is bit 31 and the significance of the individual bits decreases from bit 30 towards bit 0. Rounding with an accuracy of 16 bits then means that bit 15 is added to bit 16 after which the bits 16 to 31 are used as the result.

*2 * Fixed-point multiplication;

/ Fixed-point division;

Since the division is very costly to carry out, the result of the division is computed accurate to only as many positions as are absolutely necessary. Results of the divisions are flush right in the register containing the results.

$x_h$ means the 16 most significant bits of a 32-bits word x.

$x_l$ means the 16 least significant bits of a 32-bits word x.

16-Bits fixed-point Levinson Recursion (Pseudo code):

```
EXPa = 0;                                    X1
den = r[0];                                  X2
num = r[1];                                  X3
if (num < 0) num = -num;                     X4
a2 = num/den;                                X5
a2 = a2<<15;                                 X6
a1 = round(a2);                              X7
if(r[1] > 0)a1 = -a1;                        X8
rc1 = a1h;                                   X9
a[1] = a1h;                                  X10
a01 = 0;                                     X11
a0h = r[0];                                  X12
a0 = a0 + rc1 *2* r[1];                      X13
a0 = round(a0);                              X14
alpha = a0h;                                 X15
for (minc=2; minc<=NCOF; minc++)             X16
{ a0 = 0;                                    X17
   for (ip=1; ip < minc; ip++)               X18
      a0 = a0 + r[minc-ip] *2* a[ip]         X19
                                             X20
a0 = a0<<EXPa;                               X21
a11 = 0;                                     X22
a1 = r[minc];                                X23
a0 = a0 + a1;                                X24
a0 = round(a0);                              X25
sign = a0h;                                  X26
num = a0h;                                   X27
if (num < 0) num = -num;                     X28
if (num >= alpha)                            X29
   goto LEDUMO_failed;                       X30
a2 = num / alpha;                            X31
a2 = a2<<15;                                 X32
a1 = round(a2);                              X33
if (a0 > 0) a1 = -a1;                        X34
rc = a1h;                                    X35
                                             X36
a11 = 0;                                     X37
a1h = alpha;                                 X38
a1 = a1 + rc *2* a0h;                        X39
a1 = round(a1);                              X40
if (alpha <= 0)                              X41
   goto LEDUMO_failed;                       X42
alpha = a1h;                                 X43
                                             X44
a0 = 0;                                      X45
a1 = 0;                                      X46
for (ip=1; ip <= (minc>>1); ip++)            X47
{ a0h = a[ip];                               X48
   a0 = a0 + rc *2* a[minc-ip];              X49
a0 = round(a0);                              X50
If (overflow in a0)                          X51
{ EXPa = EXPa + 1;                           X52
   for (1p=1; 1p<minc; 1p++)                 X53
   a[1p] = a[1p]>>1;                         X54
   a0h = a[ip];                              X55
   a0 = a0 + rc *2* a[minc-ip];              X56
   a0 = round(a0);                           X57
}                                            X58
a1h = a[minc-ip];                            X59
a1 = a1 + rc *2* a[ip];                      X60
a1 = round(a1);                              X61
If (overflow in a1)                          X62
{ EXPa = EXPa + 1;                           X63
   for (1p=1; 1p<minc; 1p++)                 X64
   a[1p] = a[1p]>>1;                         X65
   a0h = a[ip];                              X66
   a0 = a0 + rc *2* a[minc-ip];              X67
   a0 = round(a0);                           X68
   a1h = a[minc-ip];                         X69
   a1 = a1 + rc *2* a[ip];                   X70
   a1 = round(a1);                           X71
}                                            X72
a[ip ] = a0h;                                X73
a[minc-ip] = a1h;                            X74
}                                            X75
a2 = a2>>EXPa;                               X76
a2 = round(a2);                              X77
if (sign > 0) a2 = -a2;                      X78
a[minc] = a2h;                               X79
}                                            X80
a[0] = EXPa;                                 X81
return;                                      X82
                                             X83
                                             X83
LEDUMO_failed:                               X84
   a[0] = -1;                                X85
   return;                                   X86
```

Explanations of the pseudo code

In fixed-point representation the prediction coefficients a[i] can only assume values between −1.0 and +1.0. Since, however, the coefficients a[i] can exceed 1.0 (rows X47 ... X75) during the recursion, all the coefficients are represented in the block floating-point format. This is to say, all the coefficients are normalized to a common basis $2^{EXPa}$, so that the mantissa of all the normalized prediction coefficients lies again between −1.0 and +1.0. At the start of the Levinson Recursion no coefficients have been computed yet, therefore the exponent EXPa is set to 0 (row X1).

Row 01 is not carried out here, because a(0)=1.0 need not additionally be computed.

Rows 02 and 03 are converted similarly in the loop having the running variable minc. Therefore, an explanation of the fixed-point resolution will be given hereinbelow.

First there will be a description of the fixed-point implementation of rows 05 to 07: In rows X17 and X19, a0 denotes a 32-bit-wide accumulation register. A multiplication input register is loaded with the autocorrelation coefficient r[minc-ip]. A further multiplication input register is loaded with the mantissa of the previously computed normalized predictor coefficient a[ip]; the associated exponent EXPa is the same for all the coefficients. It should especially be emphasized that the coefficient a[0] is not included in the normalization, because a multiplication by a[0]=1 need not additionally be carried out.

The final result of the accumulation, first without the component a[0]*2*r[minc], is reduced in row X21 from the floating-point representation to the fixed-point representation by a left shift arrangement for denormalizing the 32-bit result in accumulator a0.

In rows X22 to X24 the component a[0]*2*r[minc] is added up while a further 32-bit-wide register a1 is used. There should be noted that the lower part of the register a1 is to be erased, because, owing to its use, the auxiliary register a1 could still contain previous values at other locations.

In rows X25 to X28 the counter term for the division is prepared to compute the current ($k^{th}$) reflection coefficient rc. The division demands positive input data having a 16 bits data width which is achieved in row X25 by a rounding operation of the 32-bit-wide result in a0.

Registers at the input of a divider unit are directly loaded to carry out the division for the computation of the current ($k^{th}$) reflection coefficient rc; an exponent is not necessary. There should be stated here that in [I] the division by floating-point values of alpha and num, recovered from a0 of row X24, is carried out. This corresponds to a considerable increase of the necessary computing speed.

The result of the division in row X31 is computed with an accuracy of 17 bits, the $17^{th}$ bit being necessary for the rounding operation. This rounding is performed in row X33 to compute the current ($k^{th}$) reflection coefficient and in row X77 to compute the current ($k^{th}$) prediction coefficient. In row X32 the result of the division, of which the 17 bits are stored right-justified in the 32-bit-wide register a2, is appropriately adapted to the fixedly set decimal point before the rounding operation. After the correct sign has been used in row X34, finally the current reflection coefficient rc is derived from the upper part of the 32-bit-wide register a1 by reading the upper 16-bit-wide word a1h.

In rows X37 to X40 the new value of alpha is computed in the manner known henceforth, while all the input and output variables are represented in the 16-bit fixed-point format. Here too special mention is made of the fact that at this position in [I] computations are made with floating-point representation for alpha and a0h (a0h corresponds to sum in row 09), which corresponds to a considerable increase of the required computing speed.

In rows X45 to X74 the previously computed predictor coefficients are adapted (recomputation and adaptation of the block floating-point format). This corresponds to the operations from rows 015 to 018. The special thing about this is that in the case of an overflow during the recomputation of the prediction coefficients a[ip] and a[minc-ip] respectively, all the (coefficients already recomputed and not yet again recomputed, thus the previously computed) coefficients a[1], a[2], . . . , are reduced by the factor of ½ (=right shift by 1 bit in row X54, X65, respectively). No overflow can then take place any longer when there is a recomputation in rows X55, X56, X57 and X66 to X71, respectively.

After the adjustment of the old coefficients (computed previously) has been terminated, the new ($k^{th}$) prediction coefficient a[minc] is computed from rc (see row 020). In the fixed-point format there should be noted that also the new ($k^{th}$) coefficient is to be stored in the block floating-point format. Therefore, the reflection coefficient rc computed above, which is available in the non-normalized fixed-point format, is stored in a[minc] after a right shift by EXPa bits. With the solution given here, first the reflection coefficient, which is still stored in register a2 and has a 17-bit resolution, is shifted to the right by EXPa bits and subsequently rounded with an accuracy of 16 bits. This is the decisive difference from the solution published in [I] in which the reflection coefficient already rounded directly after the division is shifted to the right by EXPa bits and the new prediction coefficient is derived by clipping to 16 bits. This very difference at this position leads to the 16-bit fixed-point implementation of the Levinson Recursion described here which produces better results with attendant considerably less cost of computation than the solution shown in [I].

Figure 2:
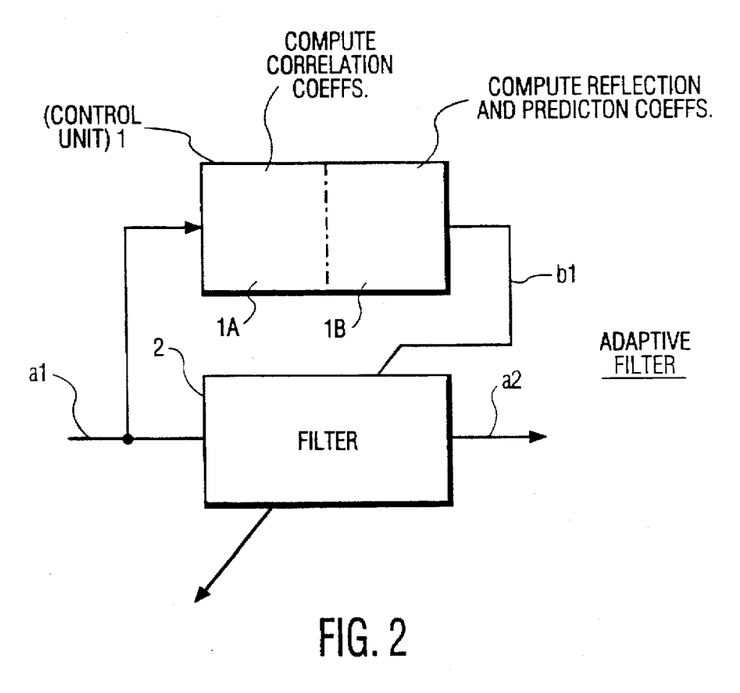
FIG. 2 shows the basic circuit diagram of an adaptive prediction filter.

FIG. 2 shows an adaptive prediction filter. Such prediction filters comprise a digital filter in a narrower sense 2 and a control unit 1. The filter in the narrower sense 2 produces output values y(n) according to equation (1) and sends them over a line a2. Input values s(n) are applied both to the filter in the narrower sense 2 and to the control unit 1 over a line a1.

The control unit 1 may also coarsely be subdivided into two functional units 1A and 1B. The functional unit 1A computes correlation coefficients from a section of the input signal and conveys these values to the functional unit 1B which computes therefrom, pursuant to the expression (2), new prediction coefficients in accordance with the program steps described above. The control unit 1 then substitutes over a line b1 the whole block of new prediction coefficients computed by unit 1B for the prediction coefficients used so far. The described filter comprising the functional unit 1B can be used several times in modern speech codecs.

Figure 3:
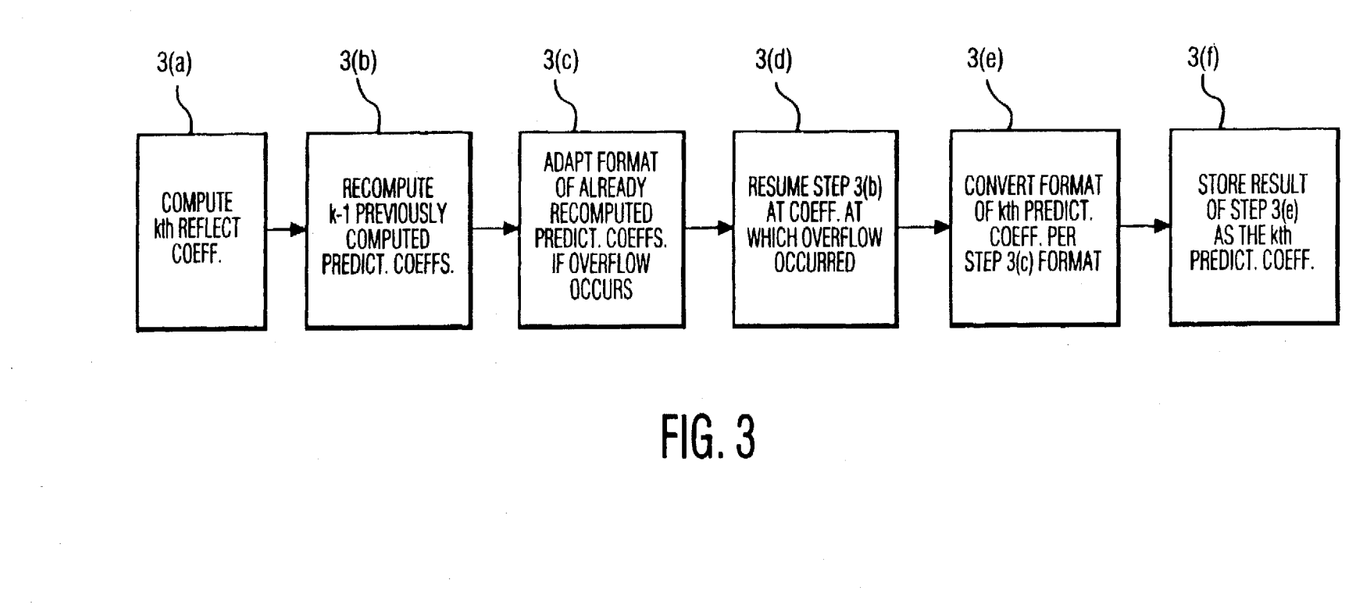
FIG. 3 is a flow chart of the operational algorithm carried out by the adaptive prediction filter in FIG. 2.

The operational algorithm carried by the adaptive filter in FIG. 2 is summarized by the flow chart in FIG. 3. Referring to FIG. 3, in block (3a) the kth reflection coefficient is computed, and based thereon in block (3b) recomputation of the (k–1) previously computed prediction coefficients is undertaken. If during that operation an overflow occurs, so that N bits are no longer sufficient to represent the recomputed prediction coefficients, then in step (3c) the block floating point format of the prediction coefficients which have already been recomputed but not yet again recomputed is adapted to account for the overflow. In step (3d) the recomputation commenced in step (3b) is resumed starting with the coefficient at which overflow had occurred. In step (3e) the format of the kth prediction coefficient, which is derived from the kth reflection coefficient computed in step (a), is converted to floating point format using the same exponent as that of the format determined in step (3c). That results in the kth prediction coefficient, which is stored for use in encoding or decoding the sampled audio signal being transmitted.

Figure 4:
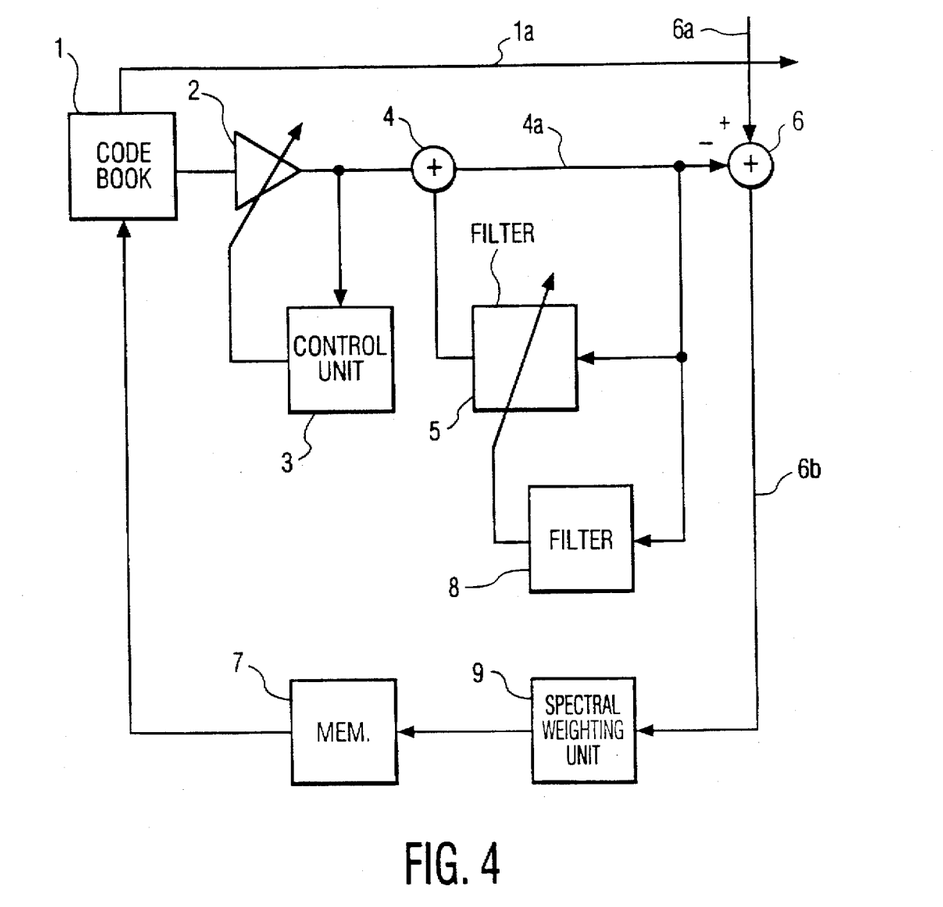
FIG. 4 shows the basic circuit diagram of a speech coder and FIG. 5a, b, and c show diagrams for clarifying a difference between the invention and the state of the art.

FIG. 4 shows a predictive speech coder by which the coded speech signal is also decoded to improve the coding. Therefore, a special description of a decoder is omitted.

The speech signal to be coded is applied in the form of sampling values to the coder via a line 6a. A subtracter 6 subtracts therefrom the appropriate values of the speech signal again decoded by the coder, which speech signal is applied to the subtracter 6 over a line 4a. Over a line 6b the difference is sent to a unit 9 which makes a spectral weighting of the difference signal (for an extensive description see, for example, CHEN, J. H.: HIGH-QUALITY 16 KB/s SPEECH CODING WITH A ONE-WAY DELAY LESS THAN 2 MS. 1990, IEEE S9.1, pp. 453 to 456), after which for a speech signal segment the sum of the error squares is formed and stored in memory 7. For a segment of the speech signal on line 6a, 128 different coding options are tested and, finally, the option bringing about the fewest errors is sent to the receiver as a code signal.

These 128 options arise from the fact that a code book referenced 10 stores 128 so-called vectors. Each vector is a sequence of sampling values, which sequence contains a simulation of the signal, by which the vocal tract of a human being can be excited, for example, for resonance. The vectors are read consecutively from code book 1 and scaled by a controllable scaler 2 (this corresponds to the volume control when human speech is generated). The scaler 2 is controlled via a unit 3. Subsequently, the scaled vectors are fed to a predictor 4, 5 and 8 having backward prediction. The predictor forms a copy of the operation of the human vocal tract. It comprises a filter 5, 8 as shown in FIG. 2. Such filters are furthermore included in the units 3 and 9. Via a line 1a is transmitted, for example, the number of the vector that has led to the fewest errors in the current speech signal segment.

Figure 5A:
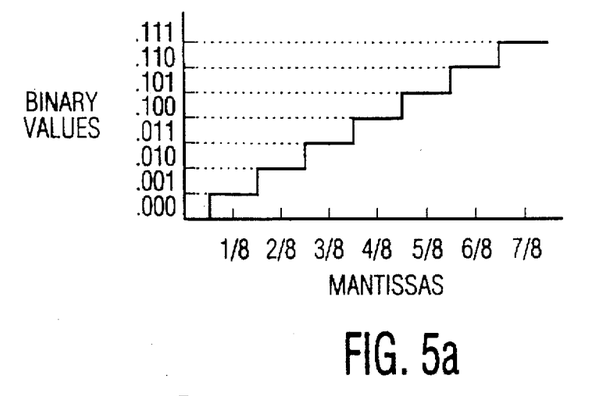
Figure 5B:
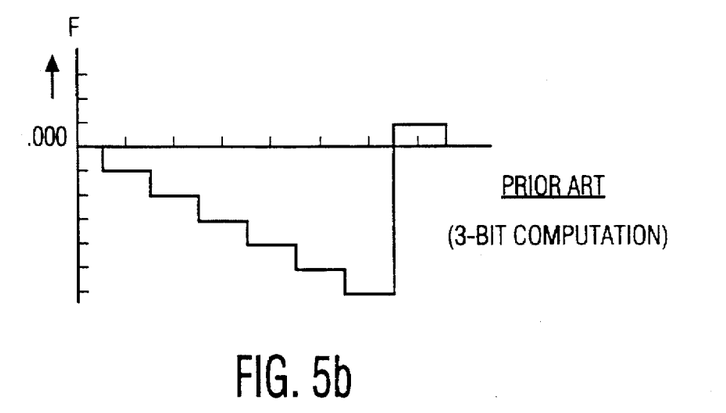
Figure 5C:
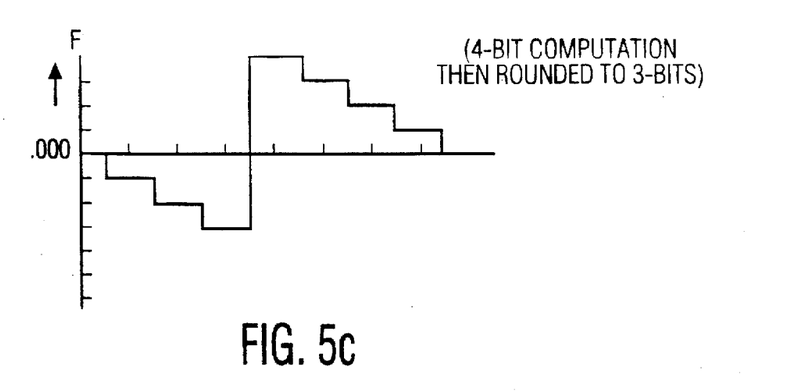

The diagrams of FIG. 5(a), (b) and (c) graphically show what has been demonstrated hereinbefore with respect to two examples, that is to say, that with the conversion of prediction coefficients in a block floating point format with mantissas to 3 bits, the invention on average produces better results than according to the state of the art (I). Output data are all the positive binary numbers with 4-bits resolution. To facilitate the comparison of the two lower diagrams, the upper diagram FIG. 5(a) shows an assignment of the output data in binary representation (the sign bit is omitted) as against their representation in fractions.

The middle diagram FIG. 5(b) shows the error F which is made if the output data are first rounded according to [I] and then the mantissas are computed with 3-bits resolution.

The lower diagram FIG. 5(c) shows the error F which is made if the mantissas are first computed with 4-bits resolution and then rounded to 3 bits. The scale for the error F is the same in either case and corresponds to that of the upper diagram FIG. 5(a).

I claim:

1. A coder for encoding a sampled audio signal, said coder including an adaptive prediction filter which comprises:
   first processing means for computing correlation coefficients from the sampled values of segments of the sampled audio signal;
   second processing means for computing reflection coefficients and prediction coefficients from said correlation coefficients in N-bit fixed point arithmetic; and
   third processing means which, in cooperation with said second processing means, provides recursive recalculation of the prediction coefficients in block floating point format by the steps of:
   (a) computing a kth reflection coefficient;
   (b) recomputing the k-1 previously computed prediction coefficients based on the kth reflection coefficient determined in step (a);
   (c) adapting the block floating point format of those of the k-1 prediction coefficients already recomputed and not yet again recomputed if an overflow occurs during the recomputations performed in step (b), so that N bits are no longer sufficient to represent the recomputed prediction coefficient;
   (d) continuing with recomputation of the k-1 prediction coefficients starting with the coefficient at which overflow occurred in step (c);
   (e) converting the kth prediction coefficient derived from the kth reflection coefficient computed in step (a), to a floating point format number having the same exponent as the adapted block floating point format determined in step (c); and
   (f) storing the number obtained in step (e) as the kth prediction coefficient;
   said sampled audio signal being encoded by said coder in accordance with said prediction coefficients.

2. A terminal unit comprising a sampled audio signal transmitter which includes a coder as claimed in claim 1.

3. A decoder for decoding an encoded sampled audio signal, said decoder including an adaptive prediction filter which comprises:
   first processing means for computing correlation coefficients from the sample values of segments of the encoded sampled audio signal;
   second processing means for computing reflection coefficients and prediction coefficients from said correlation coefficients in N-bit fixed point arithmetic; and
   third processing means which, in cooperation with said second processing means, provides recursive recalculation of the prediction coefficients in block floating point format by the steps of:
   (a) computing a kth reflection coefficient;
   (b) recomputing the k-1 previously computed prediction coefficients based on the kth reflection coefficient determined in step (a);
   (c) adapting the block floating point format of those of the k-1 prediction coefficients already recomputed and not yet again recomputed if an overflow occurs during the recomputations performed in step (b), so that N bits are no longer sufficient to represent a recomputed prediction coefficient;
   (d) continuing with recomputation of the k-1 prediction coefficients starting with the coefficient at which overflow occurred in step (c);
   (e) converting the kth prediction coefficient, derived from the kth reflection coefficient computed in step (a), to a floating point format number having the same exponent as the adapted block floating point format determined in step (c); and
   (f) storing the number obtained in step (e) as the kth prediction coefficient;
   said encoded sampled audio signal being decoded by said decoder in accordance with said prediction coefficients.

4. A terminal unit comprising a sampled audio signal receiver which includes a decoder as claimed in claim 3.

5. An adaptive prediction filter for a sampled audio signal, said filter comprising:
   first processing means for computing correlation coefficients from the sampled values of segments of the sampled audio signal;
   second processing means for computing reflection coefficients and prediction coefficients from said correlation coefficients in N-bit fixed point arithmetic; and
   third processing means which, in cooperation with said second processing means, provides recursive recalculation of the prediction coefficients in block floating point format by the steps of:

(a) computing a kth reflection coefficient;

(b) recomputing the k−1 previously computed prediction coefficients based on the kth reflection coefficient determined in step (a);

(c) adapting the block floating point format of those of the k−1 prediction coefficients already recomputed and not yet again recomputed if an overflow occurs during the recomputations performed in step (b), so that N bits are no longer sufficient to represent a recomputed prediction coefficient;

(d) continuing with recomputation of the k−1 prediction coefficients starting with the coefficient at which overflow occurred in step (c);

(e) converting the kth prediction coefficient derived from the kth reflection coefficient computed in step (a), to a floating point format number having the same exponent as the adapted block floating point format determined in step (c); and (f) storing the number obtained in step (e) as the kth prediction coefficient;

said sampled audio signal being filtered by said filter in accordance with said prediction coefficients.

6. A terminal unit comprising a sampled audio signal transmitter which includes an adaptive prediction filter as claimed in claim 5.

7. A terminal unit comprising a sampled audio signal receiver which includes an adaptive prediction filter as claimed in claim 5.

* * * * *